US012464741B2

(12) United States Patent
Wierzkowski et al.

(10) Patent No.: US 12,464,741 B2
(45) Date of Patent: Nov. 4, 2025

(54) STACKED HIGH-BLOCKING InGaAs SEMICONDUCTOR POWER DIODE

(71) Applicant: AZUR SPACE Solar Power GmbH, Heilbronn (DE)

(72) Inventors: Thorsten Wierzkowski, Heilbronn (DE); Daniel Fuhrmann, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 422 days.

(21) Appl. No.: 17/209,151

(22) Filed: Mar. 22, 2021

(65) Prior Publication Data

US 2021/0296509 A1    Sep. 23, 2021

(30) Foreign Application Priority Data

Mar. 20, 2020    (DE) .................... 10 2020 001 843.2

(51) Int. Cl.
*H10D 8/00* (2025.01)
*H10D 8/01* (2025.01)
(Continued)

(52) U.S. Cl.
CPC ............. *H10D 8/422* (2025.01); *H10D 8/043* (2025.01); *H10D 62/60* (2025.01); *H10D 62/85* (2025.01)

(58) Field of Classification Search
CPC ..... H01L 29/8613; H01L 29/20; H01L 29/36; H01L 29/66204; H01L 29/0657;
(Continued)

(56) References Cited

U.S. PATENT DOCUMENTS

| 10,074,540 B2 | 9/2018 | Dudek |
| 10,192,745 B2 | 1/2019 | Dudek |

(Continued)

FOREIGN PATENT DOCUMENTS

| DE | 102016013540 A1 | 5/2018 |
| DE | 102016013541 A1 | 5/2018 |

(Continued)

OTHER PUBLICATIONS

Koel et al; "Characterization of the temperature dependent behavior of snappy phenomenon by the switching-off of GaA's power diode structures"; WIT Transactions on Engineering Sciences, vol. 83, 2014 WIT Press pp. 439-449.

(Continued)

*Primary Examiner* — Syed I Gheyas
(74) *Attorney, Agent, or Firm* — Muncy, Geissler, Olds & Lowe, P.C.

(57) ABSTRACT

A stacked high-blocking III-V semiconductor power diode and manufacturing method, wherein the III-V semiconductor power diode comprises a first highly doped semiconductor contact area, a low-doped semiconductor drift region disposed beneath the first semiconductor contact area, a highly doped second semiconductor contact area disposed beneath the semiconductor drift region, and two terminal contact layers, at least the first semiconductor contact area forms a core stack, the core stack is surrounded by a dielectric frame region along the side face, the upper surface or lower surface of the core stack and the dielectric frame region terminate with each other or form a step with respect to each other, and semiconductor areas of the III-V semiconductor power diode arranged beneath the first semiconductor contact area are each either surrounded by the core stack or form a carrier portion.

25 Claims, 4 Drawing Sheets

(51) Int. Cl.
  *H10D 62/60* (2025.01)
  *H10D 62/85* (2025.01)
(58) Field of Classification Search
  CPC ............... H01L 29/205; H01L 29/8611; H01L 29/6609; H01L 29/861; H10D 8/422; H10D 8/043; H10D 62/60; H10D 62/85; H10D 8/411; H10D 62/117; H10D 62/824; H10D 8/01; H10D 8/00
  See application file for complete search history.

(56) References Cited

U.S. PATENT DOCUMENTS

| | | | |
|---|---|---|---|
| 10,263,124 | B2 | 4/2019 | Dudek |
| 10,312,381 | B2 | 6/2019 | Dudek |
| 10,340,394 | B2 | 7/2019 | Dudek |
| 10,468,551 | B2 | 11/2019 | Li et al. |
| 10,734,532 | B2 | 8/2020 | Dudek |
| 10,784,381 | B2 | 9/2020 | Dudek |
| 2007/0278626 | A1 | 12/2007 | Fuchs et al. |
| 2008/0203426 | A1* | 8/2008 | Uemura ............ H01L 29/7371 257/E29.189 |
| 2009/0179310 | A1* | 7/2009 | Dunton ............ H01L 29/8615 257/656 |
| 2015/0279930 | A1 | 10/2015 | Breymesser et al. |
| 2019/0312151 | A1* | 10/2019 | Dudek ............ H01L 29/0661 |

FOREIGN PATENT DOCUMENTS

| | | |
|---|---|---|
| DE | 102016015056 A1 | 6/2018 |
| DE | 102017002935 A1 | 9/2018 |
| DE | 102017002936 A1 | 9/2018 |
| EP | 3553827 A1 | 10/2019 |
| WO | WO2008051503 A2 | 5/2008 |

OTHER PUBLICATIONS

German Ashkinazi: "GaAs Power Devices", pp. 8-9, ISBN: 965-7094-19-4.
Rybalchenko et al; "Metamorphic InGaAs photo-converters on GaAs substrates"; Journal of Physics Conference Series 690—2016.
Kanber et al; "Optimization of Selective Area Growth of GaAs by Low Pressure Organometallic Vapor Phase Epitaxy for Monolithic Integrated Circuits", Journal of Electronic Materials, vol. 23, No. 2—1994.
Jung Daehwan et al; "Design and growth of mulit-functional InAsP metamorphic buffers for mid-infrared quantum well lasers on InP"; Journal of Applied Physics—Jan. 2019.
Loke et al; "Selective-area epitaxial growth of GaAs in deep dielectric windows using molecular beam epitaxy"; Journal of Crystal Growth 222—2001.
O'Sullivan et al; Selective-area epitaxy for GaAs-on-InP optoelectronic integrated circuits (OEICs); Semiconductor Science and Technology—1993.
Abstract for Haas et al; "Nanoimprint and selective-area MOVPE for growth of GaAs/InAs core/shell nanowires"; Nanotechnology—Feb. 2013.
Abstract for Kunert et al; "III/V nano ridge structures for optical applications on patterned 300 mm silicon substrate"; Applied Physics Letters—2016.
Abstract for Besselov et al; "Passivation of GaAs in alcohol solutions of ammonium sulfide"; Semiconductors—1997.
Abstract for Tamanuki et al; "Ammonium sulfide passivation for AlGaAs/GaAs buried heterostructure laser fabrication process"; Japanese Journal of Applied Physics, Part 1—1991.
Abstract for Xuan et al; "Simplified Surface Preparation for GaAs Passivation Using Atomic Layer-Deposted High-/ Dielectrics"; IEEE Transactions on Electron Devices, vol. 54, Issue 8—Aug. 2007.

* cited by examiner

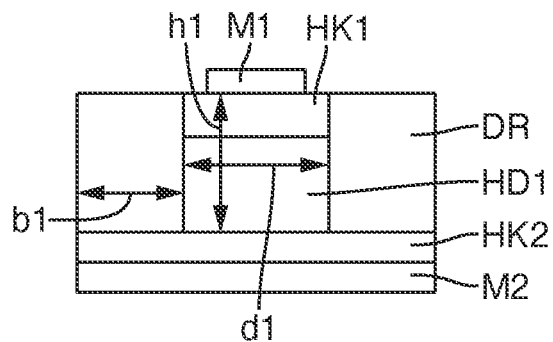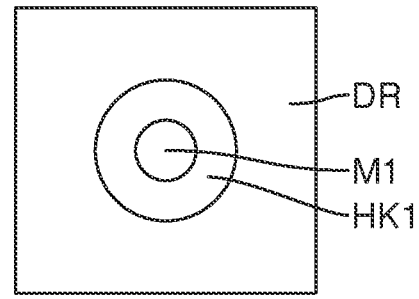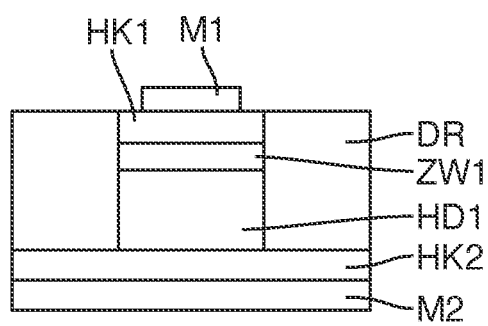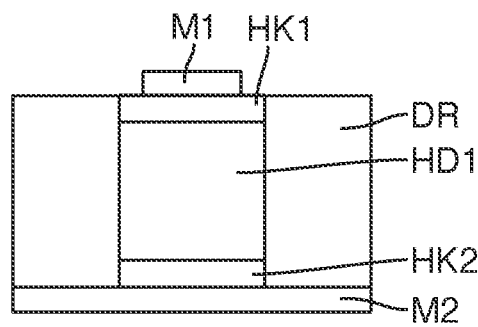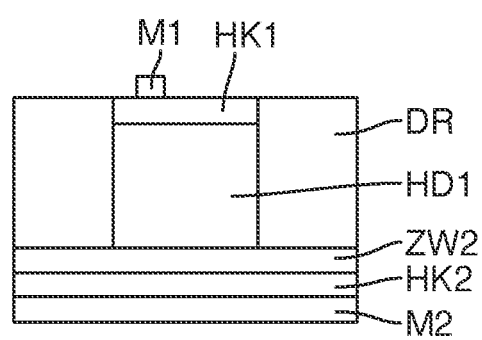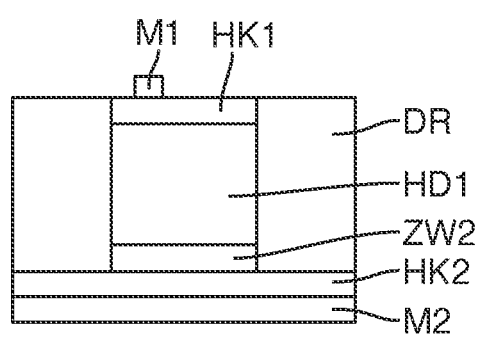

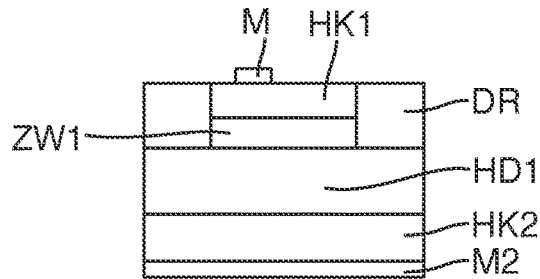
Fig. 12
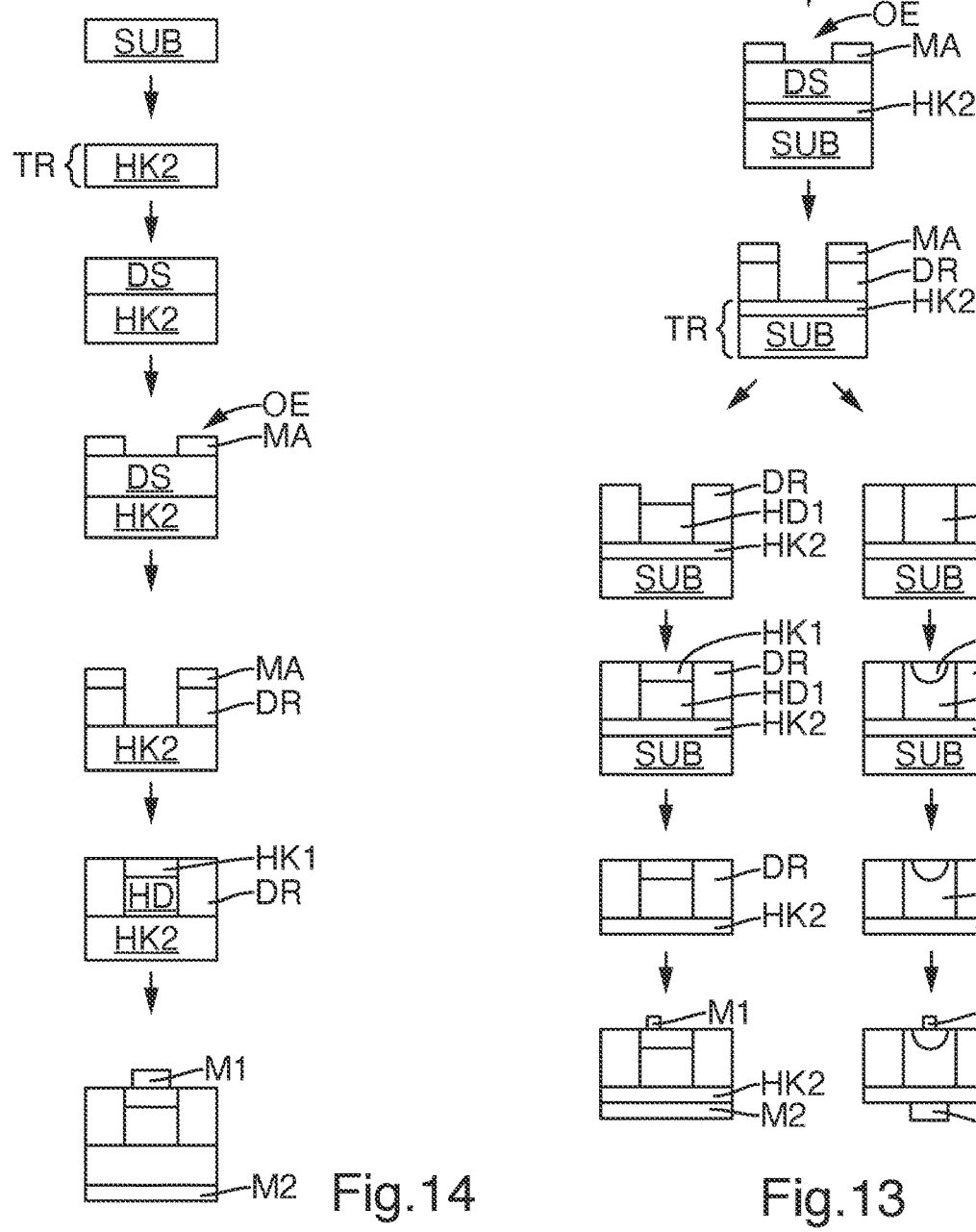
Fig. 14
Fig. 13

STACKED HIGH-BLOCKING InGaAs SEMICONDUCTOR POWER DIODE

This nonprovisional application claims priority under 35 U.S.C. § 119 (a) to German Patent Application No. 10 2020 001 843.2, which was filed in Germany on Mar. 20, 2020 and which is herein incorporated by reference.

BACKGROUND OF THE INVENTION

Field of the Invention

The present invention relates to a stacked high-blocking InGaAs power semiconductor diode.

Description of the Background Art

From "GaAs Power Devices" by German Ashkinazi, ISBN 965-7094-19-4, pages 8 and 9, a high-voltage-resistant PIN semiconductor diode made of GaAs is known.

Stacked high-blocking InGaAs semiconductor power diodes and corresponding manufacturing methods are known from the publications DE 10 2016 013 540 A1 (which corresponds to U.S. Pat. No. 10,263,124), DE 10 2016 013 541 A1 (which corresponds to U.S. Pat. No. 10,074,540), DE 10 2016 015 056 A1 (which corresponds to U.S. Pat. No. 10,192,745), DE 10 2017 002 935 A1 (which corresponds to U.S. Pat. No. 10,312,381) and DE 10 2017 002 936 A1 (which corresponds to U.S. Pat. No. 10,340,394), and which are all herein incorporated by reference.

Generic diodes have breakdown voltages above 200V and should also have, in addition to a low forward voltage, a low series resistance to reduce the power loss. Furthermore, the diodes should have the lowest possible leakage currents of less than 1 µA in the reverse direction.

The semiconductor devices are usually still protected at wafer level by passivation and/or protective layers.

Appropriate methods for III-V semiconductor devices are described, for example, from "Passivation of GaAs in alcohol solutions of ammonium sulfide," V. N. Bessolov et al, Semiconductors, Vol. 31, No. 11, pp. 1350-1356, ISSN 1063-7826, 1997 or from "Ammonium sulfide passivation for AlGaAs/GaAs buried heterostructure laser fabrication process", T. Tamanuki et al., Japanese Journal of Applied Physics, Part 1, Vol. 30, No. 3, pp. 499-500, ISSN 0021-4922, 1991 or from "Simplified Surface Preparation for GaAs Passivation Using Atomic Layer-Deposited High-/Dielectrics", Yi Xuan et al., IEEE Transactions on Electron Devices, Vol. 54, No. 8, 2007.

For separation, typically in a first mesa process, trenches are etched and then the area underneath the trenches is sawed through. The trenches are typically passivated hereafter.

It is also known to manufacture nanostructures by selective growth on a wafer covered with a patterned $SiO_2$ masking layer. Various methods are described, for example, in "Nanoimprint and selective-area MOVPE for growth of GaAs/InAs core/shell nanowires", F. Haas et al, Nanotechnology, Vol. 24, No. 8, 085603, 2013 or "III/V nano ridge structures for optical applications on patterned 300 mm silicon substrate", B. Kunert et al., Appl. Phys. Lett. 109, 091101, 2016.

SUMMARY OF THE INVENTION

Against this background, it is the object of the invention to provide a device that further develops the prior art.

In an exemplary embodiment of the invention, a stacked high-blocking III-V semiconductor power diode is provided, comprising a first highly doped semiconductor contact area of a first conductivity type having a dopant concentration of at least $1 \cdot 10^{18}$ cm$^{-3}$ and having a first lattice constant.

A low-doped semiconductor drift region of the first conductivity type or a second conductivity type with a dopant concentration of $8 \cdot 10^{11}$-$1 \cdot 10^{15}$ cm$^{-3}$ is arranged beneath the first semiconductor contact area, wherein the semiconductor drift region has the first lattice constant and a layer thickness between 10 µm-200 µm.

A highly doped second semiconductor contact area of the second conductivity type having a dopant concentration of at least $5 \cdot 10^{17}$ cm$^{-3}$ can be disposed beneath the semiconductor drift region, wherein the second semiconductor contact area has the first lattice constant or a second lattice constant.

A first metallic terminal contact layer can be formed at least in regions on an upper surface of the first semiconductor contact area, and is materially bonded to the lower surface of the first semiconductor contact area.

A second metallic terminal contact layer can be formed at least in regions beneath a lower surface of the second semiconductor contact area and, for example, is materially bonded to the lower surface of the second semiconductor contact area or to a semiconductor layer, e.g. a substrate layer or a buffer layer, which is arranged between the second semiconductor contact area and the second metallic terminal contact layer.

At least the first semiconductor contact area forms a core stack. The core stack has an upper surface and a lower surface and a side face extending from the upper surface to the lower surface.

In addition, the III-V semiconductor power diode can have a dielectric frame region, which encloses the core stack along the side face and has an upper surface and a lower surface.

The upper surface of the core stack terminates with the upper surface of the dielectric frame region or forms a first step to the upper surface of the dielectric frame region.

The lower surface of the core stack terminates with the lower surface of the dielectric frame region or forms a second step to the lower surface of the dielectric frame region.

Semiconductor areas of the III-V semiconductor power diode disposed beneath the first semiconductor contact area are each either enclosed by the core stack or form a substrate region, wherein the substrate region is disposed beneath the core stack and the frame region and is materially bonded to a common lower surface, formed by the lower surface of the dielectric frame region and the lower surface of the core stack.

In other words, the III-V semiconductor power diode always has a core stack, which is surrounded by the frame region, and a carrier portion arranged underneath is optional.

For example, both the drift region and the second semiconductor contact area co-form the core stack, so that the III-V-semiconductor power diode either has no substrate region or has a substrate region formed from another semiconductor layer, e.g. a substrate. In an alternative embodiment, for example, the drift region is formed as part of the core stack and the III-V-semiconductor power diode has a substrate region formed at least from the second semiconductor contact area.

Alternatively, the core stack comprises only the first semiconductor contact area or, if necessary, another semiconductor interlayer, with both the drift region and the second semiconductor contact area being formed in the substrate region.

It should be noted that the metallic terminal contact layers are each electrically highly conductive.

Preferably, the metallic terminal contact layers are formed of one or more metal layers, wherein the metal layers preferably comprise Ge and/or Au and/or Pd and/or Ag. The metallic terminal contact layers establish an electrically low-resistance contact to the highly doped semiconductor contact areas.

If the second mechanical terminal contact layer on the lower surface is the largest possible, particularly over the entire surface, thermal coupling to a substrate is improved and the resistance of the device is reduced. A full-surface design is defined as coverage of at least 70% or at least 80% of the lower surface of the second semiconductor contact area.

The second metallic terminal contact layer can be formed as points or as limited surface sections or also finger-shaped.

In an example, the III-V semiconductor power diode does not have a carrier portion and the second metallic terminal contact layer can be formed over the entire surface of the lower surface of the III-V semiconductor power diode, i.e. the second metallic terminal contact layer covers a common lower surface formed by the lower surface of the core stack and the lower surface of the frame region.

Furthermore, it is understood that the metallic terminal contact layers can be connected by means of bonding wires having contact fingers, the so-called pins, in that the semiconductor power diodes are arranged on a carrier, for example in the form of a lead frame.

It should also be noted that the term "semiconductor layer" or "semiconductor contact layer" can be used synonymously with the term "semiconductor area" or "semiconductor contact area" or "semiconductor contact" or "semiconductor contact region".

It is understood that all semiconductor areas of the power diode, i.e. in particular the first and second semiconductor contact area and the drift region, can be formed in layers, in particular as planar layers, i.e. have a planar or substantially planar upper surface and lower surface.

In particular, the first and/or the second semiconductor contact area are formed in a trough shape in an alternative embodiment. It is further understood that the trough-shaped areas preferably extend from an upper surface of another planar semiconductor layer into this planar semiconductor layer.

A trough-shaped semiconductor contact area can be created within an area of a layered drift region by introducing dopants into said area, said area preferably extending trough-shaped into the drift region.

Alternatively, a layered semiconductor contact area is created in a drift region by implanting dopants, e.g., a layer of a desired depth adjoining the upper surface of the drift region is transformed into the semiconductor contact areas by implantation.

All semiconductor layers of the power diode are preferably created epitaxially, e.g. by MOVPE or by LPE or by CVD, or by implantation or diffusion. Alternatively or supplementarily, one or more layers of the substrate region are bonded together by means of a wafer bond.

It is understood that only the semiconductor areas or semiconductor layers or at least a major part of the semiconductor area or semiconductor layers of the high-blocking III-V semiconductor diode are formed of III-V materials, e.g. GaAs, InGaP, InGaAs, AlGaAs or InP.

Alternatively, the high-blocking III-V semiconductor diode additionally comprises semiconducting layers made of other semiconductor materials or additional layers made of other non-semiconductor materials.

III-V semiconductors, in particular GaAs or InGaAs, provide particularly high charge carrier mobility.

Furthermore, it is understood that a semiconductor area or layer formed of a III-V material must be formed only substantially of III-V material or, in addition to a III-V material, i.e. a material which contains one or more elements of the III. and/or V. main group, may still contain impurities and/or dopants.

The same applies to a semiconductor area or semiconductor layer consisting of GaAs or of InGaAs or of another expressly named combination of materials.

If a layer has an expressly named combination of materials, this states that the material of the layer substantially consists of a compound of the expressly named materials and optionally of other elements of the III. and/or V. main group. A layer comprising GaAs can thus be, for example, a GaAsP layer or AlGaAs layer.

It is also understood that the high-blocking III-V semiconductor diode can be formed with an n-on-p or a p-on-n structure. Accordingly, either the first conductivity type is n and the second conductivity type is p, or vice versa.

The terms "lower" and "upper" or "beneath" and "above" serve solely to describe the arrangement of the individual layers and areas relative to each other and do not indicate an absolute direction.

It is noted that the dielectric frame region is made of a dielectric material or a material having dielectric properties. Preferably, the dielectric frame region consists of $Si_xO_y$, e.g. $SiO_2$, or of $Si_xN_y$, e.g. SiN, or $Al_xO_y$ or of $Ta_xO_y$ or $Ti_xO_y$ or of $Hf_xO_y$. Alternatively, the frame region has SixOy or SixNy or AlxOy or TaxOy or TixOy or HfxOy. In another embodiment, the dielectric frame region is formed as an oxide, e.g. of $Al_2O_3$ or $Ta_2O_5$ or $TiO_2$ or $HfO_2$, or as having a rare earth.

The dielectric frame region is preferably layered with a through opening, which receives the core stack.

The resulting common layer has, for example, a planar common upper surface and/or a planar common lower surface. Alternatively, the core stack protrudes beyond the upper surface and/or the lower surface of the dielectric frame region, so that an ascending step forms at the junction from the dielectric frame region to the core stack.

In another alternative embodiment, the upper surface of the core stack does not extend to the upper surface of the dielectric frame region, such that a descending step is formed at the junction from the upper surface of the dielectric frame region to the upper surface of the core stack.

The resulting common layer of frame region and core stack may also be disposed on a carrier portion, so that a common lower surface (the lower surface of the common layer) formed by the lower surface of the frame and the lower surface of the core stack is bonded to the upper surface of the carrier portion.

Preferably, the outer side face of the frame region terminates with the side faces of the carrier portion, i.e. the carrier portion can have a diameter equal to the sum of the diameter of the core stack and twice the wall thickness of the frame region.

The frame region provides adequate protection or sufficient passivation of the side faces or the p-n junction, so that no further passivation layers are required. Leakage currents are reliably suppressed and high breakdown voltage and efficiency are achieved.

An advantage is that the epitaxial deposition of the III-V semiconductor layers within the dielectric frame region prevents the formation of surface states that normally form on the semiconductor surface due to the oxygen contained in the air and that lead to reduced breakdown voltages and reductions in device efficiency. In addition, the p-n junction in the frame region remains protected, so that moisture penetration is very reliably prevented. Moisture in particular leads to higher leakage currents and low breakdown voltages, so that moisture penetration must be prevented, in particular in the case of high-blocking devices.

In addition, the frame region enables the separate generation of individual power diodes by selective growth. This makes it particularly easy to separate the III-V semiconductor power diodes of the invention by sawing alone.

Additional etching before sawing is unnecessary. Relatively inexpensive manufacturing is possible. As compared to SiC, the manufacturing costs of III-V devices are generally lower.

Also, III-V semiconductor power diodes can reach higher temperatures at the p-n junctions than Si without destroying the III-V semiconductor diodes. Thus, III-V semiconductor diodes can be used at temperatures of up to 300° C., i.e. even in hot environments.

In an example, the III-V semiconductor power diode has, between the first semiconductor contact area and the semiconductor drift region, a semiconductor interlayer of the first conductivity type having a dopant concentration of $8 \cdot 10^{12}$-$1 \cdot 10^{16}$ cm$^{-3}$. It is understood that the semiconductor interlayer is formed as part of the core stack and/or as part of the carrier portion.

In another example, the III-V semiconductor power diode has, alternatively or complementarily, an semiconductor interlayer of the second conductivity type having a dopant concentration of $8 \cdot 10^{12}$-$1 \cdot 10^{16}$ cm$^{-3}$, disposed between the second semiconductor contact area and the semiconductor drift region. It is understood that the semiconductor interlayer is formed as part of the core stack and/or as part of the carrier portion.

In another example, the III-V semiconductor power diode has a highly doped metamorphic buffer layer sequence, wherein the metamorphic buffer layer sequence is arranged between the semiconductor drift region and the second semiconductor contact area, has a dopant concentration greater than $5 \cdot 10^{17}$ cm$^{-3}$ and a layer thickness greater than 0.5 μm and less than 20 μm, is of the first conductivity type or the second conductivity type and has the first lattice constant on an upper surface facing the semiconductor drift region and the second lattice constant on an upper surface facing the second semiconductor contact area.

For example, the buffer layer sequence is part of the core stack and/or part of the carrier portion.

In a further development, the buffer layer sequence or a part of the buffer layer sequence is designed as a second semiconductor contact layer. That is, the buffer layer sequence fulfills both the function of the lattice constant compensation between the layers arranged above and beneath it and the function of the second semiconductor contact layer, or the corresponding layer has both the features of both the buffer layer sequence and the features of the second semiconductor contact layer.

In another further development, the metamorphic buffer layer sequence has a sequence of at least three layers and, for example, at most twenty layers. The metamorphic buffer is preferably highly n-doped or highly p-doped. The buffer layer sequence is formed of InGaAs, for example.

Preferably, the metamorphic buffer layer sequence has a dopant concentration greater than $5 \cdot 10^{17}$ cm$^{-3}$ and a layer thickness greater than 0.5 μm and less than 20 μm.

In an example, the metamorphic buffer layer sequence is formed of several $In_xGa_{1-x}As$ layers with x differing and/or being constant from layer to layer.

It is understood that the lattice constant inside the buffer changes at least once. In an example, for example, the lattice constant increases from layer to layer, starting from the lowest layer of the sequence with the second lattice constant towards the uppermost layer of the sequence with the first lattice constant.

Alternatively, starting from the lowest layer of the sequence, the lattice constant first increases and then decreases from layer to layer, or first decreases and then increases.

The increase or decrease of the lattice constants over the entire sequence proceeds either stepwise or linearly or also in any other form.

In another example, the III-V semiconductor power diode comprises a substrate layer, wherein the substrate layer is formed as part of the carrier portion.

The substrate layer has either the first lattice constant or a second lattice constant. For example, the substrate layer is formed as a GaAs or Ge substrate. In a further development, the substrate forms the second semiconductor contact layer.

In another embodiment, the semiconductor drift region and/or the first semiconductor contact area and/or the second semiconductor contact area consists of GaAs or InGaAs, or the semiconductor drift region and/or the first semiconductor contact area and/or the second semiconductor contact area comprise GaAs or InGaAs.

Preferably, the first conductivity type is p and the second conductivity type is n or the first conductivity type is n and the second conductivity type is p.

In another example, the first semiconductor contact area and/or the second semiconductor contact area are trough-shaped.

In another example, the frame region can be materially bonded to the side face of the core stack.

Another object of the invention is to provide a manufacturing method for a stacked high-blocking III-V semiconductor power diode, wherein a semiconductor carrier layer is provided.

A dielectric layer is deposited on an upper surface of the semiconductor carrier layer.

A mask layer having at least one through opening is then prepared on an upper surface of the dielectric layer.

After the mask layer is deposited, an etching step is performed to remove the dielectric layer in the area of the at least one through opening of the mask layer, namely up to the semiconductor carrier layer, so that the dielectric layer forms a dielectric frame region.

The mask layer is then removed.

After the etching step, one or more III-V semiconductor layers are successively deposited on the exposed upper surface of the semiconductor carrier layer, and in the metallization step, a first metallic terminal contact layer formed at least in some regions is deposited on an upper surface of the uppermost deposited III-V semiconductor layer and a second metallic terminal contact layer is deposited beneath the lowermost deposited III-V semiconductor layer.

It is understood that the named order does not necessarily reflect the temporal sequence of the individual method steps. Significant temporal relationships are therefore explicitly mentioned.

It is also understood that the method is suitable for manufacturing a III-V semiconductor power diode of the type described above and that the above comments with respect to the III-V semiconductor power diode also apply mutatis mutandis to the manufacturing method according to the invention.

It is further understood that the manufacturing process is preferably carried out at the wafer level, i.e. a plurality of III-V semiconductor power diodes are manufactured next to each other in matrix form. The devices are then separated in the dielectric frame region by sawing and have a side-wall passivation after separation.

Due to the different materials of the dielectric layer and semiconductor carrier layer, i.e. a dielectric material as compared to a III-V semiconductor material, the etching step, e.g. a dry etching step or a wet chemical etching step, can be performed with high selectivity, resulting in no or very little ablation of the semiconductor carrier layer, i.e. the carrier portion.

The recess in the dielectric layer is then at least partially or completely filled with one or more semiconductor layers, resulting in the formation on the semiconductor carrier layer of a core stack made up of semiconductor layers enclosed by the frame region.

In one embodiment, the core stack includes all semiconductor layers of the III-V semiconductor power diode, wherein the III-V semiconductor power diode is effectively exposed by removing the entire semiconductor carrier layer.

Alternatively, the core stack comprises only part of the semiconductor layers of the III-V semiconductor power diode, in particular the first highly doped semiconductor contact area and optionally also the drift region, wherein further layers, for example the second semiconductor contact area, are surrounded by the semiconductor carrier layer.

In a further embodiment, a deposited III-V semiconductor layer is a semiconductor drift region having a first or a second conductivity type and a dopant concentration of $8 \cdot 10^{11}$-$1 \cdot 10^{15}$ cm$^{-3}$.

A first highly doped semiconductor contact area of the first conductivity type having a dopant concentration of at least $1 \cdot 10^{18}$ cm$^{-3}$ is preferably manufactured either as one of the III-V semiconductor layers by deposition, after the deposition of the semiconductor drift region, or by the introduction of dopants into an upper portion of the semiconductor drift region.

In another further embodiment, the semiconductor carrier layer comprises a substrate layer, wherein the substrate layer is not, or is partially or completely removed prior to the metallization step.

A second highly doped semiconductor contact area of the second conductivity type having a dopant concentration of at least $1 \cdot 10^{18}$ cm$^{-3}$ is preferably provided by deposition on the substrate layer or by introducing impurities into a portion of the substrate layer or by introducing impurities into the entire substrate layer or by providing a substrate layer having a dopant concentration of at least $5 \cdot 10^{17}$ cm$^{-3}$ as part of the semiconductor carrier layer.

Alternatively, a second highly doped semiconductor contact area of the second conductivity type having a dopant concentration of at least $1 \cdot 10^{18}$ cm$^{-3}$ is manufactured after removal of the semiconductor carrier layer by introducing dopants into a bottom portion of the semiconductor drift region.

In another alternative embodiment, a second highly doped semiconductor contact area of a second conductivity type having a dopant concentration of at least $1 \cdot 10^{18}$ cm$^{-3}$ is manufactured by deposition after the etching step for opening the dielectric layer, i.e. for creating the through opening, and before the deposition of the semiconductor drift region as a III-V semiconductor layer.

In another embodiment, in the metallization step, the second metallic terminal contact layer is deposited on a lower surface of the second semiconductor contact layer.

The provided semiconductor carrier layer preferably has a GaAs substrate or a Ge substrate or an Si substrate.

In another embodiment, the dielectric layer comprises SixOy, e.g., SiO$_2$, or Si$_x$Ni$_y$ or AlxOy or TaxOy or TixOy or HfxOy, or consists of SixOy or of Si$_x$Ni$_y$ or of Al$_x$O$_y$ or of Ta$_x$O$_y$ or of Ti$_x$O$_y$ or of Hf$_x$O$_y$.

The deposition is preferably carried out by MOVPE or by LPE or by CVD.

In another further development, the first semiconductor contact area is generated by implantation or by diffusion. Thus, impurities are introduced by implantation or diffusion into another semiconductor layer, e.g. the drift region, and the corresponding area of the drift region then forms or becomes the first semiconductor contact area.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows a cross-sectional view of a first embodiment of a III-V semiconductor power diode, FIG. 2 shows a plan view of the first embodiment of the III-V semiconductor power diode, FIG. 3 shows a cross-sectional view of a second embodiment of the III-V semiconductor power diode, FIG. 4 shows a cross-sectional view of a third embodiment of the III-V semiconductor power diode, FIG. 5 shows a cross-sectional view of a fourth embodiment of the III-V semiconductor power diode, FIG. 6 shows a cross-sectional view of a fifth embodiment of the III-V semiconductor power diode, FIG. 12 shows a cross-sectional view of an eleventh embodiment of the Ill-V semiconductor power diode, FIG. 13 shows a view of a first embodiment of a manufacturing method for a III-V semiconductor power diode, FIG. 14 shows a view of a further embodiment of a manufacturing method for a III-V semiconductor power diode.

DETAILED DESCRIPTION

Figure 7:
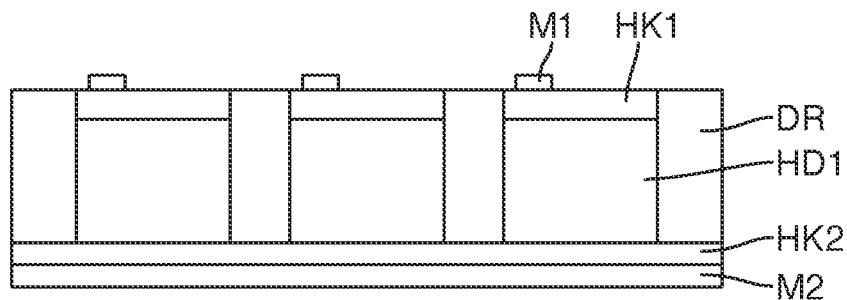
FIG. 7 shows a cross-sectional view of a sixth embodiment of the III-V semiconductor power diode.

For reasons of clarity, only a sectional view or cross-sectional view of a stacked high-blocking III-V semiconductor power diode HLD is shown in each of the figures. The stack of layers has an upper surface and a lower surface.

It should be noted that all III-V semiconductor power diodes HLD shown in the sectional view have either a square or a rectangular or a round circumference, or a rectangular circumference with rounded corners in a plan view.

FIG. 1 illustrates a stacked high-blocking III-V semiconductor power diode HLD.

The semiconductor power diode HLD has a first highly doped semiconductor contact area HK1 of the first conductivity type, a drift region HD1 of the first conductivity type or of a second conductivity type, and a second highly doped semiconductor contact area HK2 of the second conductivity type.

The first highly doped semiconductor contact area HK1 and the drift region together form a core stack having an upper surface, a lower surface, a side face extending from the upper surface to the lower surface, a diameter d1, and a height h1. The first semiconductor contact area HK1 and the drift region are each formed as a layer of the core stack.

The upper surface of the core stack is formed by the first highly doped semiconductor contact area and a first metallic terminal contact layer M1 is materially bonded to the upper surface.

The side face of the core stack is surrounded by a dielectric frame region DR, wherein an upper surface of the dielectric frame region DR terminates with the upper surface of the core stack, i.e. forms a planar common surface.

A lower surface of the dielectric frame region DR and the lower surface of the core stack also terminate with each other or likewise form a flat common bottom surface. Accordingly, the dielectric frame region DR also has the height h1.

In addition, the dielectric frame region DR has a width b1, i.e. a wall thickness that surrounds the core stack.

The second semiconductor contact area HK2 is layered with a diameter or an edge length of d1+2·b1 and materially bonded to the common lower surface of the core stack and the frame region DR.

A second metallic terminal contact layer M2 covers a lower surface of the second semiconductor contact area HK2.

It is understood that the semiconductor power diode HLD can be formed both as an n over p structure, i.e. with n as the first conductivity type and p as the second conductivity type, as well as p over n structure, i.e. with p as the first conductivity type and n as the second conductivity type.

The semiconductor drift region HD1 has either the first or the second conductivity, i.e. it is either weakly n-doped or weakly p-doped. Accordingly, the p-n junction of the semiconductor power diode is formed either between the second semiconductor contact area and the drift region or between the first semiconductor contact area and the drift region.

It is understood that the terms "upper", "above" and "lower", "beneath" only serve to arrange the individual areas and layers relative to each other and do not indicate an absolute direction.

FIG. 2 shows a plan view of the III-V semiconductor power diode of FIG. 1.

The dielectric frame region DR as well as the underlying layers, i.e. the second semiconductor contact area HK2 and the second metallic terminal contact layer M2, each have a square circumference with the same dimensions.

The core stack, i.e. the drift region HD1 and the first semiconductor contact area HK1, on the other hand, have a round circumference. The first metallic terminal contact layer also has a round circumference, wherein the diameter of the first metallic terminal contact layer M1 is smaller than the diameter of the first semiconductor contact area.

The round circumference of the core stack is easy to manufacture and is particularly advantageous in terms of electrical properties. In terms of separation by sawing, on the other hand, it is particularly easy to manufacture a square or rectangular circumference of the entire device.

In embodiments not shown, other shapes are also possible or advantageous for the circumference of the core stack and/or the entire device, e.g. a polygonal, e.g. octagonal, circumference of the core stack or of the entire device.

The first metallic terminal contact layer also preferably has, in further embodiments not shown, other circumferential shapes, e.g. polygonal.

FIG. 3 shows a further embodiment. In the following, only the differences to FIG. 1 are explained.

The III-V semiconductor power diode HLD has a first interlayer ZW1, which is arranged as part of the core stack between the first semiconductor contact area HK1 and the semiconductor drift region HD1.

FIG. 4 shows a further embodiment. In the following, only the differences to FIG. 1 are explained.

The III-V semiconductor power diode HLD has a second interlayer ZW2, which is arranged between the second semiconductor contact area HK2 and the semiconductor drift region HD1 and is materially bonded to the common lower surface of the core stack and the dielectric frame region DR.

FIG. 5 shows a further embodiment. In the following, only the differences to FIG. 4 are explained.

Alternatively, the second interlayer ZW2 is formed as part of the core stack, in particular as the lowest layer of the core stack.

FIG. 6 shows a further embodiment. In the following, only the differences to FIG. 1 are explained.

The second semiconductor contact area is also formed as part of the core stack, namely as the bottom layer of the core stack. The second metal terminal contact layer M2 is materially bonded to the common lower surface, which consists of the lower surface of the core stack and the lower surface of the dielectric edge region.

FIG. 7 shows a further embodiment. In the following, only the differences to FIG. 1 are explained.

Prior to separation, several III-V semiconductor power diodes HLD are connected by a common dielectric frame region DR. In addition, in the illustrated embodiment, the semiconductor power diodes HLD are connected by a common second semiconductor contact area HK2 and a common second metallic terminal contact layer.

It is understood that the further embodiments can also be manufactured together on one wafer and have corresponding common structures. In addition to the frame region DR, it is particularly advantageous to manufacture all layers arranged beneath the frame region DR and the core stack as common layers. Separation is preferably achieved by a single sawing step.

Figure 8:
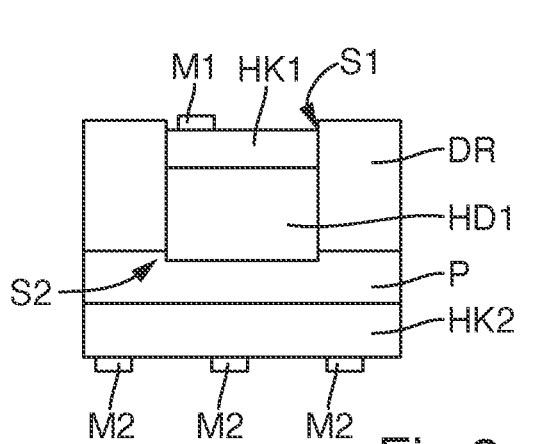
FIG. 8 shows a cross-sectional view of a seventh embodiment of the III-V semiconductor power diode.

FIG. 8 shows a further embodiment. In the following, only the differences to FIG. 1 will be explained.

The III-V semiconductor power diode HLD has a buffer layer sequence P, wherein the buffer layer sequence P is arranged beneath the dielectric frame region DR and the core stack and above the second semiconductor contact area HK2.

On the upper surface, the core stack forms a first step S1 ascending towards the dielectric frame region and a second step S2 descending towards the lower surface of the dielectric frame region DR. The steps are each created, for example, as a result of an etching process during manufacture.

The second metallic terminal contact layer M2 is finger-shaped, i.e. has several finger-shaped and, for example, parallel sections which are preferably connected to each other by a further transverse section.

Figure 9:
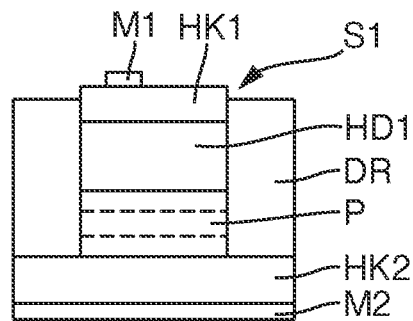
FIG. 9 shows a cross-sectional view of an eighth embodiment of the III-V semiconductor power diode.

FIG. 9 shows another embodiment. In the following, only the differences to FIG. 8 are explained.

Alternatively, the buffer layer sequence P is formed as part of the core stack. For example, the buffer layer sequence has three layers, each with a different lattice constant (shown in dashed lines).

The core stack has a first step descending toward the upper surface of the dielectric frame region, while the lower surfaces of the dielectric frame region and of the core stack in this exemplary embodiment terminate with each other.

The second metallic terminal contact layer is flat.

Figure 10:
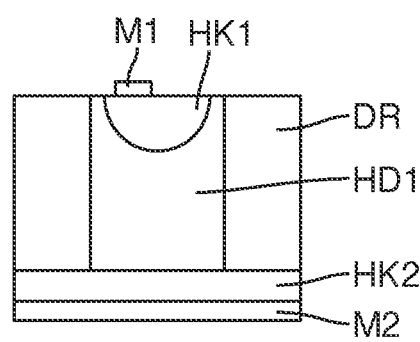
FIG. 10 shows a cross-sectional view of a ninth embodiment of the III-V semiconductor power diode.

FIG. 10 shows another embodiment. In the following, only the differences to FIG. 1 are explained.

The first semiconductor contact area HK1 is trough-shaped and extends from the upper surface of the core stack into the core stack, here into the semiconductor drift layer HD1.

Figure 11:
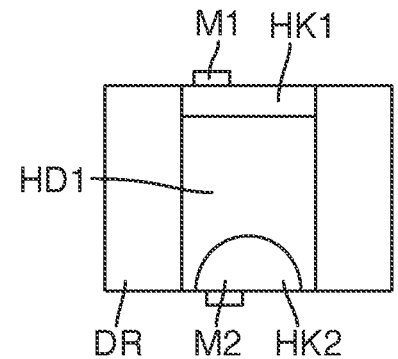
FIG. 11 shows a cross-sectional view of a tenth embodiment of the III-V semiconductor power diode.

FIG. 11 shows a further embodiment. In the following, only the differences to FIG. 1 are explained.

Alternatively, the second semiconductor contact area HK2 is trough-shaped and extends from the lower surface of the core stack into the core stack.

In a further development, not shown, the two semiconductor contact areas HK1 and HK2 are designed to project into the core stack in the shape of a trough.

FIG. 12 shows a further embodiment. In the following, only the differences to FIG. 1 are explained.

The core stack of the high-blocking III-V semiconductor power diode HLD has the first semiconductor contact area HK1 and the first semiconductor interlayer ZW1. The drift region HD1 forms the carrier portion together with the second semiconductor contact area HK2 and the second metallic connection contact layer M2.

FIG. 13 schematically shows first embodiments according to the invention of a manufacturing method for a high-blocking III-V semiconductor power diode HLD.

A highly doped second semiconductor contact layer HK2 is deposited on a substrate layer SUB, e.g. by MOVPE or LPE or CVD, wherein the substrate layer SUB together with the second semiconductor contact layer HK2 serve as a semiconductor carrier layer TR.

A dielectric layer DS, e.g. an SiO$_2$ layer, is deposited on an upper surface of the semiconductor carrier layer TR. Subsequently, a mask layer MA with at least one through opening OE is deposited on an upper surface of the dielectric layer DS.

In an etching step, the dielectric layer DS is removed in the area of the at least one through opening OE of the mask layer MA, at least up to the semiconductor carrier layer TR. It is understood that by means of the etching process, possibly part of the semiconductor carrier layer TR, in this case the second semiconductor contact layer HK2, is etched away. The part of the dielectric layer DS that remains after the etching step forms a dielectric frame region DR.

The mask layer MA is removed again.

A semiconductor drift layer HD1 is deposited on the exposed upper surface of the semiconductor carrier layer TR, in this case the second semiconductor contact layer HK2, wherein a grown layer thickness of the semiconductor drift layer HD1 is either less than (left path of FIG. 13) or equal to (right path of FIG. 13) or greater than (not shown) the height of the dielectric frame region.

Subsequently, a first highly doped semiconductor contact layer HK1 is either deposited on an upper surface of the semiconductor drift layer HD1 (left path of FIG. 13) or generated by introducing dopants into an area of the semiconductor drift layer HD1 which adjoin an upper surface of the semiconductor drift layer HD1 (right path of FIG. 13).

Subsequently, the substrate layer SUB is removed.

In a metallization step, a first metallic terminal contact layer M1 formed at least in regions is deposited on an upper surface of the first semiconductor contact layer HK1 and a second metallic terminal contact layer M2 is deposited on the lower surface of the second semiconductor contact layer HK2.

The illustration of FIG. 14 schematically shows a further embodiment according to the invention of the manufacturing method for a high-blocking III-V semiconductor power diode HLD. In the following, only the differences to FIG. 13 are explained.

The provided substrate layer is converted into a highly doped semiconductor contact layer HK2 by introducing dopants and serves as a semiconductor carrier layer TR.

Accordingly, the method step of removing the substrate is omitted, wherein the substrate layer is thinned in a further development.

Figure 15:
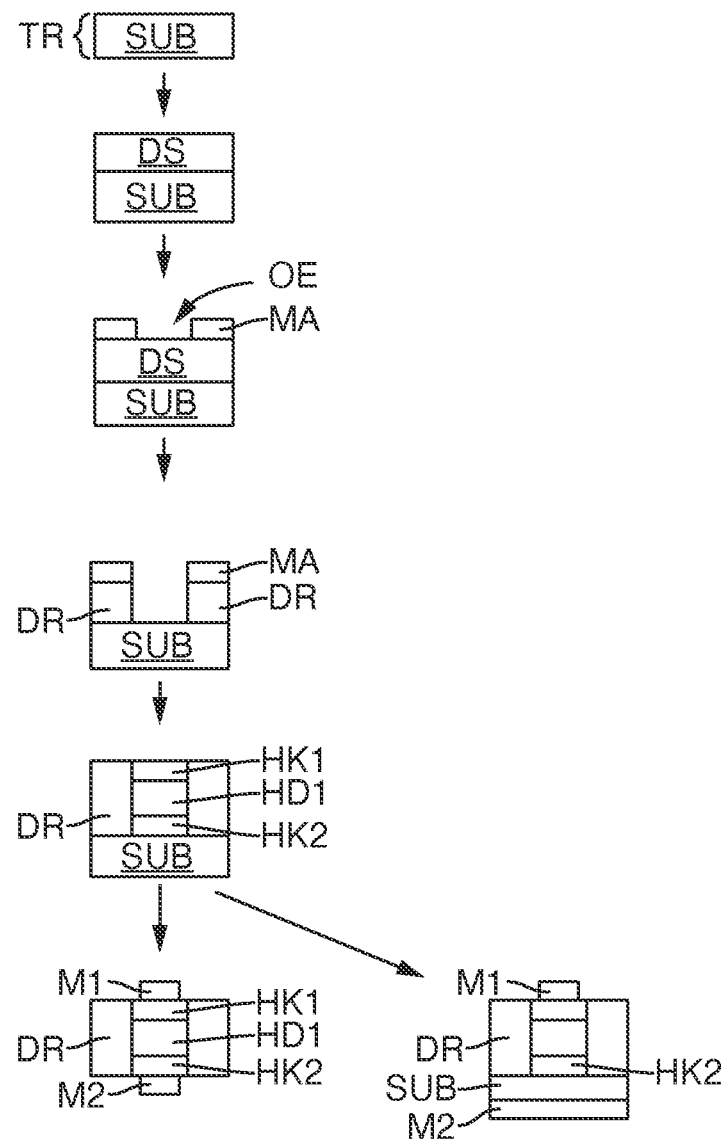
FIG. 15 shows a view of a further embodiment of a manufacturing method for a III-V semiconductor power diode.

FIG. 15 schematically shows further embodiments according to the invention of a manufacturing method for a high-blocking III-V semiconductor power diode HLD.

The substrate layer SUB serves as the carrier layer TR. After the masking and etching process, the second semiconductor contact layer HK2, the drift region HD1 and the first semiconductor contact layer HK1 are successively grown on the exposed surface area of the carrier layer TR, i.e. the substrate SUB.

The carrier layer TR, i.e. the substrate layer SUB, is then removed and the first and second metallic terminal contact layers are deposited (left path of FIG. 15).

Alternatively, the substrate layer SUB is not or only partially removed (thinned) and the second metallic terminal contact layer M2 is deposited on a lower surface of the substrate layer SUB (right path of FIG. 15).

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A high-blocking 111-V semiconductor power diode comprising:
   a highly doped first semiconductor contact area of a first conductivity type having a dopant concentration of at least $1 \cdot 10^{18}$ cm$^{-3}$ and having a first lattice constant;
   a low-doped semiconductor drift region of the first conductivity type or of a second conductivity type arranged beneath the first semiconductor contact area having a dopant concentration of $8\cdot10^{11}$-$1\cdot10^{15}$ cm$^{-3}$ and having the first lattice constant and a layer thickness of 10 µm-200 µm;

a highly doped second semiconductor contact area of the second conductivity type arranged beneath the semiconductor drift region having a dopant concentration of at least $5\cdot10^{17}$ cm$^{-3}$ and having a second lattice constant;

a highly doped metamorphic buffer layer sequence disposed between the semiconductor drift region and the second semiconductor contact area, the metamorphic buffer layer sequence having the first lattice constant on an upper surface facing the semiconductor drift region and the second lattice constant on a lower surface facing the second semiconductor contact area;

a first metallic terminal contact layer, which is formed at least in regions and is materially bonded with an upper surface of the first semiconductor contact area; and a second metallic terminal contact layer, which is formed at least in regions and is arranged beneath a lower surface of the second semiconductor contact area, wherein at least the first semiconductor contact area forms a core stack having an upper surface, a lower surface, and a side face extending from the upper surface to the lower surface, wherein the 111-V semiconductor power diode has a dielectric frame region enclosing the core stack along the side face, the dielectric frame region having an upper surface at an uppermost portion of the dielectric frame region and a lower surface at a lowermost portion of the dielectric frame region, and the upper surface of the dielectric frame region being directly over the lower surface of the dielectric frame region, wherein the upper surface of the core stack terminates with the upper surface of the dielectric frame region or forms a first step to the upper surface of the dielectric frame region, wherein the lower surface of the core stack terminates with the lower surface of the dielectric frame region or forms a second step to the lower surface of the dielectric frame region, and wherein semiconductor areas of the 111-V semiconductor power diode arranged beneath the first semiconductor contact area are each either included in the core stack or form a carrier portion, and wherein the carrier portion is arranged beneath the core stack and the dielectric frame region and is provided with a common lower surface, which is formed by the lower surface of the dielectric frame region and the lower surface of the core stack, and are materially bonded.

2. The high-blocking 111-V semiconductor power diode according to claim 1, wherein the dielectric frame region consists of SixOy or of SixNy or of AlxOy or of TaxOy or of TixOy or of HfxOy or comprises SixOy or SixNy or AlxOy or TaxOy or TixOy or HfxOy.

3. The high-blocking 111-V semiconductor power diode according to claim 1, wherein the 111-V semiconductor power diode has, between the first semiconductor contact area and the semiconductor drift region, a semiconductor interlayer of the first conductivity type having a dopant concentration of $8\cdot10^{12}$-$1\cdot10^{16}$ cm$^{-3}$.

4. The high-blocking 111-V semiconductor power diode according to claim 1, wherein the 111-V semiconductor power diode comprises, between the second semiconductor contact area and the semiconductor drift region, a semiconductor interlayer of the second conductivity type having a dopant concentration of $8\cdot10^{12}$-$1\cdot101$s cm-3.

5. The high-blocking 111-V semiconductor power diode according to claim 1, wherein the metamorphic buffer layer sequence has a dopant concentration greater than $5\cdot10^{17}$ cm$^{-3}$ and a layer thickness greater than 0.5 µm and less than 20 µm, and is of the first conductivity type or the second conductivity type.

6. The high-blocking 111-V semiconductor power diode according to claim 1, wherein the metamorphic buffer layer sequence is part of the core stack and/or part of the carrier portion.

7. The high-blocking 111-V semiconductor power diode according to claim 1, wherein the 111-V semiconductor power diode comprises a substrate layer, and wherein the substrate layer is formed as part of the carrier portion.

8. The high-blocking 111-V semiconductor power diode according to claim 1, wherein the semiconductor drift region and/or the first semiconductor contact area and/or the second semiconductor contact area consists of GaAs or InGaAs or the semiconductor drift region and/or the first semiconductor contact area and/or the second semiconductor contact area comprise GaAs or InGaAs.

9. The high-blocking 111-V semiconductor power diode according to claim 1, wherein the first conductivity type is p and the second conductivity type is n, or wherein the first conductivity type is n and the second conductivity type is p.

10. The high-blocking 111-V semiconductor power diode according to claim 1, wherein the first semiconductor contact area and/or the second semiconductor contact area is well-shaped.

11. The high-blocking 111-V semiconductor power diode according to claim 1, wherein the frame region is materially bonded to the side face of the core stack.

12. The high-blocking 111-V semiconductor power diode according to claim 1, wherein a cross-section of the core stack has a round circumference or an octagonal circumference.

13. A high-blocking 111-V semiconductor power diode comprising:

a highly doped first semiconductor contact area of a first conductivity type;

a low-doped semiconductor drift region of the first conductivity type or of a second conductivity type arranged beneath the first semiconductor contact area, the semiconductor drift region having a first lattice constant;

a highly doped second semiconductor contact area of the second conductivity type arranged beneath the semiconductor drift region, the second semiconductor contact area having a second lattice constant;

a highly doped metamorphic buffer layer sequence disposed between the semiconductor drift region and the second semiconductor contact area, the metamorphic buffer layer sequence having the first lattice constant on an upper surface facing the semiconductor drift region and the second lattice constant on a lower surface facing the second semiconductor contact area;

a first metallic terminal contact layer materially bonded with an upper surface of the first semiconductor contact area; and a second metallic terminal contact layer arranged beneath a lower surface of the second semiconductor contact area, wherein at least the first semiconductor contact area and the semiconductor drift region form a core stack having an upper surface, a lower surface, and a side face extending from the upper surface to the lower surface, wherein the 111-V semiconductor power diode has a dielectric frame region enclosing the core stack along the side face, the dielectric frame region having an upper surface at an uppermost portion of the dielectric frame region and a lower surface at a lowermost portion of the dielectric frame region, and the upper surface of the dielectric frame region being directly over the lower surface of the dielectric frame region, wherein the upper surface of the core stack terminates with the upper surface of the dielectric frame region, wherein the lower surface of the core stack terminates with the lower surface of the dielectric frame region, and wherein the second semiconductor contact area is either included in the core stack or part of a carrier portion, and wherein the carrier portion is arranged beneath the core stack and the dielectric frame region and is materially bonded with the lower surface of the dielectric frame region and the lower surface of the core stack.

14. The high-blocking 111-V semiconductor power diode according to claim 13, wherein a cross-section of the core stack has a round circumference or an octagonal circumference.

15. The high-blocking 111-V semiconductor power diode according to claim 13,
   wherein the first semiconductor contact area has a dopant concentration of at least $1 \cdot 10^{18}$ cm-$^3$ and has a first lattice constant;
   wherein the semiconductor drift region has a dopant concentration of $8 \cdot 10^{11}$-$1 \cdot 10^{15}$ cm-$^3$ and has a layer thickness of 10 µm-200 µm;
   wherein the second semiconductor contact area has a dopant concentration of at least $5 \cdot 10^{17}$ cm-$^3$.

16. The high-blocking 111-V semiconductor power diode according to claim 13, wherein the dielectric frame region consists of SixOy or of SixNy or of AlxOy or of TaxOy or of TixOy or of HfxOy or comprises SixOy or SixNy or AlxOy or TaxOy or TixOy or HfxOy.

17. The high-blocking 111-V semiconductor power diode according to claim 13, wherein the 111-V semiconductor power diode has, between the first semiconductor contact area and the semiconductor drift region, a semiconductor interlayer of the first conductivity type having a dopant concentration of $8 \cdot 10^{12}$-$1 \cdot 10^{16}$.

18. The high-blocking 111-V semiconductor power diode according to claim 13, wherein the 111-V semiconductor power diode comprises, between the second semiconductor contact area and the semiconductor drift region, a semiconductor interlayer of the second conductivity type having a dopant concentration of $8 \cdot 10^{12}$-$1 \cdot 10^{16}$ cm-$^3$.

19. The high-blocking 111-V semiconductor power diode according to claim 13,
   wherein the metamorphic buffer layer sequence has a dopant concentration greater than $5 \cdot 10^{17}$ cm-$^3$ and a layer thickness greater than 0.5 µm and less than 20 µm, and is of the first conductivity type or the second conductivity type.

20. The high-blocking 111-V semiconductor power diode according to claim 13, wherein the metamorphic buffer layer sequence is part of the core stack and/or part of the carrier portion.

21. The high-blocking 111-V semiconductor power diode according to claim 13, wherein the semiconductor drift region and/or the first semiconductor contact area and/or the second semiconductor contact area consists of GaAs or InGaAs or the semiconductor drift region and/or the first semiconductor contact area and/or the second semiconductor contact area comprise GaAs or InGaAs.

22. The high-blocking 111-V semiconductor power diode according to claim 13, wherein the first conductivity type is p and the second conductivity type is n, or wherein the first conductivity type is n and the second conductivity type is p.

23. The high-blocking 111-V semiconductor power diode according to claim 13, wherein the first semiconductor contact area and/or the second semiconductor contact area is well-shaped.

24. The high-blocking 111-V semiconductor power diode according to claim 13, wherein the frame region is materially bonded to the side face of the core stack.

25. The high-blocking 111-V semiconductor power diode according to claim 13, wherein the 111-V semiconductor power diode comprises a substrate layer, and wherein the substrate layer is formed as part of the carrier portion.

* * * * *